(12) United States Patent
Shen et al.

(10) Patent No.: US 7,982,539 B2
(45) Date of Patent: Jul. 19, 2011

(54) HIGH RESOLUTION VARIABLE GAIN CONTROL

(75) Inventors: David H. Shen, San Jose, CA (US); Ann P. Shen, Saratoga, CA (US); Chien-Meen Hwang, San Jose, CA (US)

(73) Assignee: NanoAmp Mobile, Inc., Saratoga, CA (US)

( * ) Notice: Subject to any disclaimer, the term of this patent is extended or adjusted under 35 U.S.C. 154(b) by 0 days.

(21) Appl. No.: 12/191,769

(22) Filed: Aug. 14, 2008

(65) Prior Publication Data
US 2009/0051429 A1 Feb. 26, 2009

Related U.S. Application Data (60) Provisional application No. 60/957,199, filed on Aug. 22, 2007.

(51) Int. Cl.
*H03G 3/30* (2006.01)
(52) U.S. Cl. ............ 330/279; 330/129; 330/278
(58) Field of Classification Search .......... 330/254, 330/278, 279, 282, 129; 341/120, 126, 138–140, 341/144, 145, 155, 156
See application file for complete search history.

(56) References Cited

U.S. PATENT DOCUMENTS

| | | | |
|---|---|---|---|
| 4,553,104 A * | 11/1985 | Olsen | 330/279 |
| 5,351,050 A | 9/1994 | Thompson et al. | |
| 5,732,334 A | 3/1998 | Miyake | |
| 6,181,201 B1 | 1/2001 | Black | |
| 6,201,831 B1 | 3/2001 | Agazzi et al. | |
| 6,498,926 B1 | 12/2002 | Ciccarelli et al. | |
| 6,498,927 B2 | 12/2002 | Kang et al. | |
| 7,174,190 B2 | 2/2007 | Walker et al. | |
| 7,187,915 B2 | 3/2007 | Wang et al. | |
| 7,218,258 B2 | 5/2007 | Delanghe et al. | |
| 7,231,195 B2 | 6/2007 | Nakayama | |
| 7,236,117 B1 | 6/2007 | Varma et al. | |
| 2002/0160734 A1 | 10/2002 | Li et al. | |
| 2008/0150775 A1* | 6/2008 | Nozawa et al. | 341/139 |

FOREIGN PATENT DOCUMENTS

KR 2003-0084933 11/2003

OTHER PUBLICATIONS

International Search Report and Written Opinion issued on Jan. 30, 2009, in co-pending PCT Application PCT/US2008/073547 (12 pages).

* cited by examiner

*Primary Examiner* — Khanh V Nguyen (57) ABSTRACT

A gain circuit includes an analog section with variable gain and a digital section with variable gain. The gain steps for the digital section have a higher resolution than the gain steps for the analog section. In some implementations, gain steps can be achieved much finer than 0.1 db or less without sensitivity to device tolerances.

16 Claims, 9 Drawing Sheets

HIGH RESOLUTION VARIABLE GAIN CONTROL

CROSS REFERENCE TO RELATED APPLICATIONS

This application claims the benefit of priority from U.S. Provisional Application entitled "HIGH RESOLUTION VARIABLE GAIN CONTROL", Application No. 60/957,199 filed Aug. 22, 2007, the disclosure of which is incorporated by reference.

TECHNICAL FIELD

The current disclosure relates to gain control in integrated circuits, such as gain control for wired and wireless communication systems.

BACKGROUND

Variable gain amplification can be common in both the transmitter and receiver blocks of communications systems. On the receiver, input signals can span a wide range of amplitudes. The receiver may use gain settings in order to properly amplify and decode the input signal information. On the transmitter side, the gain of the transmitter signal levels may be adjusted in order to improve signal fidelity, optimize power consumption, and/or reduce interference on the receiver terminals.

SUMMARY

In some aspects, some implementations feature a method of operating a gain circuit including an analog section and a digital section. The method involves receiving an input signal, and amplifying the input signal using the analog section of the gain circuit. The analog section is configured to amplify the input signal using a first gain. The method involves adjusting the first gain using a first set of gain steps, and amplifying the input signal using the digital section of the gain circuit. The digital section is configured to amplify the input signal using a second gain. The method also involves adjusting the second gain using a second set of gain steps, in which a resolution of the second set of gain steps is greater than a resolution of the first set of gain steps.

These and other implementations can optionally include one or more of the following features. The input signal can include an analog input signal. The step of amplifying the input signal using the analog section of the gain circuit can include receiving the analog input signal at an input of the analog section and generating an analog output signal at an output terminal of the analog section. The method can involve converting the analog output signal to a digital signal. The step of amplifying the input signal using the digital section of the gain circuit can include receiving the digital signal at an input terminal of the digital section, and generating a digital output signal at an output terminal of the digital section. The step of generating the digital output signal can include amplifying the digital signal using the second gain to generate an amplified digital signal, and compensating the amplified digital signal to correct for errors introduced by the analog section. The step of compensating the amplified digital signal to correct for errors introduced by the analog section can include compensating the amplified digital signal using compensation values in a compensation table. The method can also involve determining the compensation values before operation of the gain circuit, by instructions sent to the gain circuit, or dynamically during operation of the gain circuit.

These and other implementations can optionally include one or more of the following features. The step of amplifying the input signal at the digital section of the gain circuit can include receiving the input signal at an input of the digital section, and generating a digital output signal at an output terminal of the digital section. The step of amplifying the input signal using the analog section of the gain circuit can include converting the digital output signal to an analog signal, receiving the analog signal at an input terminal of the analog section, and generating an analog output signal at an output terminal of the analog section. The input signal to the gain circuit can include an analog input signal, and the step of receiving the input signal at an input of the digital section can include converting the analog input signal to a digital input signal. The input signal can include a digital input signal, and the step of receiving the input signal at an input of the digital section can include receiving the digital input signal at the input of the digital section. The step of generating the digital output signal can include amplifying the input signal using the second gain to generate an amplified input signal, and compensating the amplified input signal to correct for errors introduced by the analog section. The step of compensating the amplified input signal to correct for errors introduced by the analog section can include compensating the amplified input signal using compensation values in a compensation table. The resolution of the first set of gain steps can be on an order of 1 dB. The resolution of the second set of gain steps can be from less than 1 dB to an order of 0.01 dB or less.

In some aspects, some implementations feature a method of operating a gain circuit including an analog section and a digital section. The method includes receiving an analog input signal at an input terminal of an analog section of the gain circuit. The analog section is configured to amplify the analog input signal using a first gain. The method includes generating an analog output signal at an output terminal of the analog section, adjusting the first gain using a first set of gain steps, converting the analog output signal to a digital input signal, and receiving the digital input signal at an input terminal of the digital section, in which the digital section is configured to amplify the analog output signal using a second gain. The method also includes generating a digital output signal at an output terminal of the digital section, and adjusting the second gain using a second set of gain steps, in which a resolution of the second set of gain steps is greater than a resolution of the first set of gain steps.

These and other implementations can optionally include one or more of the following features. The resolution of the first set of gain steps can be on an order of 1 dB. The resolution of the second set of gain steps can be from less than 1 dB to an order of 0.01 dB or less. The gain circuit can include a variable gain amplifier (VGA). The analog section and the digital section can be coupled via an analog-to-digital converter (ADC). The method can involve generating gain controls to the first and the second sets of gain steps with a gain control circuit. The analog section can include one or more components for analog gains. The digital section can include any combination of a digital signal processor, a compensation circuit, and/or one or more digital components. The method may involve executing signal processing operations or producing the fine tuning of the gain steps with the digital signal processor or the one or more digital components. The method can involve correcting one or more errors with the compensation circuit, in which the compensation circuit uses the digital signal processor and/or the one or more digital components to correct analog errors generated by the analog section. The method can involve employing a compensation table with compensation values. The compensation values can be determined before operation of the gain circuit, determined by instructions sent to the gain circuit, and/or calculated dynamically during operation of the gain circuit. The method can involve employing a calibration circuit to calibrate the compensation values manually or automatically. The digital section can include a digital-to-analog converter (DAC) coupled at the output terminal of the digital section. The gain circuit can include a digital-to-analog converter (DAC) that has an output terminal that is coupled to the input terminal of the analog section. The method can involve employing the DAC to receive a digital input signal for the gain circuit and converting the received digital input signal to the analog input signal at the input terminal of the analog section.

In some aspects, some implementations feature a gain circuit to generate fine tuning of gain steps. The gain circuit includes an analog section including an input terminal and an output terminal. The analog section is used to receive an analog input signal at the input terminal of the analog section and generate an analog output signal at the output terminal of the analog section. The analog section is used to control the analog output signal at the output terminal of the analog section with coarse tuning of the analog input signal. The coarse tuning includes a first set of gain steps. The first set of gain steps correspond to the analog section. The output terminal of the analog section is coupled to an input terminal of the digital section. The gain circuit includes a digital section that includes the input terminal and an output terminal. The digital section is used to generate a digital output signal at the output terminal of the digital section. The digital section is used to control the digital output signal at the output terminal of the digital section with fine tuning of the analog output signal. The fine tuning includes a second set of gain steps. The second set of gain steps corresponds to the digital section. A first gain step resolution corresponding to the second set of gain steps is greater than a second gain resolution corresponding to the first set of gain steps.

These and other embodiments can optionally include one or more of the following features. The analog section can include an analog-to-digital converter (ADC) to provide analog-to-digital conversion of the analog output signal at the output terminal of the analog section. The gain circuit can include a control circuit to generate gain controls for the first and the second sets of gain steps. The analog section can include one or more components for analog gains. The digital section can include any combination of a digital signal processor, a compensation circuit, and/or one or more digital components. The digital signal processor and/or the one or more digital components can be used for executing signal processing operations and/or producing the fine tuning of the gain steps. The gain circuit of claim can include a compensation circuit to correct one or more errors, in which the compensation circuit can use the digital signal processor and/ or the one or more digital components to correct analog errors generated by the analog section. The gain circuit can include a compensation table that includes one or more compensation values. The compensation values can be determined before operation of the gain circuit, determined by instructions sent to the gain circuit, and/or calculated dynamically during operation of the gain circuit. The gain circuit can include a calibration circuit to calibrate the compensation values manually or automatically. The digital section can include a digital-to-analog converter (DAC) coupled at the output terminal of the digital section. The gain circuit can include a digital-to-analog converter (DAC) that has an output terminal that is coupled to the input terminal of the analog section, in which the DAC can include functionality to receive a digital input signal for the gain circuit and convert the received digital input signal to the analog input signal at the input terminal of the analog section. The gain circuit can include a variable gain amplifier. The resolution of the first set of gain steps can be on an order of 1 dB. The resolution of the second set of gain steps is from less than 1 dB to an order of 0.01 dB or less.

In some aspects, some implementations feature a method to calibrate one or more values to compensate for errors generated by a gain circuit. The method includes, for a gain circuit with an analog section that has an output terminal coupled to an input terminal of a digital section, generating an analog input signal for the analog section at a start of a calibration process, and setting a first compensation gain value for an initial compensation gain level to 1 dB. The analog and digital sections include gain controls for setting gain levels. For the analog section, the method includes setting an analog gain control for a coarse gain level to a first gain step, generating an analog output signal at the output terminal of the analog section, and sending the analog output signal to an analog-to-digital converter (ADC). For the digital section, the method includes coupling a digital output of the digital-to-analog converter to the input terminal of the digital section, setting a digital gain control for a fine gain level to a constant value, and generating a digital output signal at an output terminal of the digital section. The method involves measuring the digital output signal, and calculating a second compensation gain value for the coarse gain level of the first gain step using data from the analog input signal, the digital output signal, the coarse gain level, and the fine gain level. The method involves storing the second compensation value.

Any of the methods and techniques described herein can also be implemented in a system, an apparatus or device, a machine, a computer program product, in software, in hardware, or in any combination thereof. For example, the computer program product can be tangibly encoded on a computer-readable medium (e.g., a data storage unit), and can include instructions to cause a data processing apparatus (e.g., a data processor) to perform one or more operations for any of the methods described herein, such as executing the calibration and/or compensation techniques.

Some implementations may have potential advantages, for example, by providing new techniques for implementing variable gain control, fine gain steps, gain error detection and calibration, and DC offset correction in the system. Other advantages that may be provided by some implementations include gain steps much finer than 1 dB, such as 0.1 dB, or even 0.01 dB or less, without affecting the sensitivity to device and manufacturing process tolerances.

The details of one or more implementations are set forth in the accompanying drawings and the description below. Other features will be apparent from the description and drawings, and from the claims.

DETAILED DESCRIPTION

Some implementations employ a combination of analog and digital gain controls. In addition, some implementations employ coarse and fine gain steps for high accuracy, as well as provisions for compensating for analog errors and calibration, including gain errors and DC offset.

Figure 1:
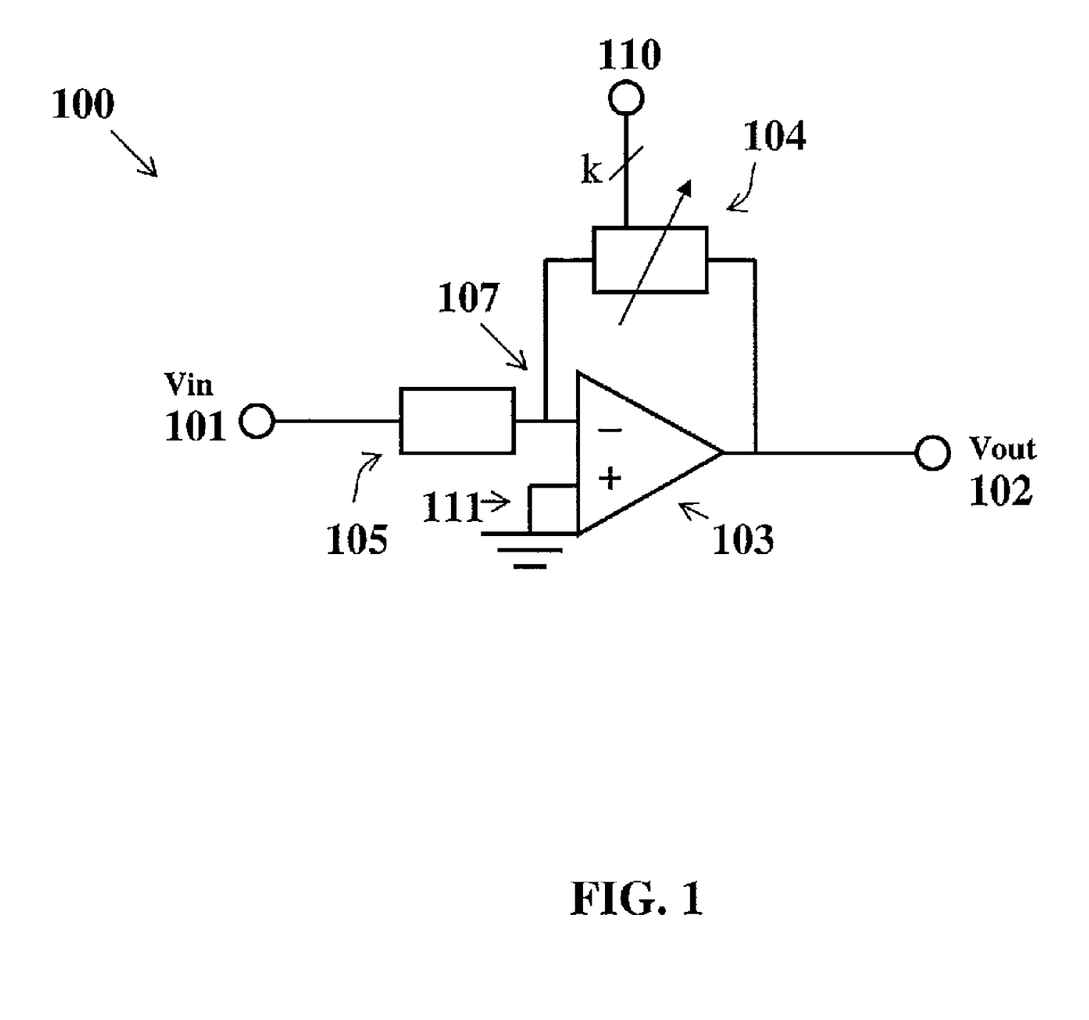
FIG. 1 is a schematic of an example of a variable gain amplifier with a digitally-controlled impedance element.

FIG. 1 is a schematic of an example of a variable gain amplifier 100 with a digitally-controlled impedance element. Variable gain amplifier 100 includes an operational amplifier 103 having a non-inverting input terminal 111, an inverting input terminal 107, and an output terminal 102. Analog input terminal 101 is coupled to the inverting input terminal 107 through a first impedance element 105. The inverting input terminal 107 is coupled to the output terminal 102 through a digitally-controlled, variable impedance element 104. The non-inverting input of the operational amplifier 103 is coupled to ground. A digital gain control 110 is coupled to variable feedback impedance element 104.

During operation, an analog input signal Vin is applied to analog input terminal 101 and passed through first impedance element 105 and the operational amplifier 103 to produce an amplified, analog output signal Vout on the output terminal 102. Impedance elements 104 and 105 are used to set the gain. In this example, the impedance value R2 of impedance element 105 is fixed while the impedance value R1 of impedance element 104 is controlled by a digital gain control signal of k bits applied to the digital gain control 110. Different values of the digital gain control signal cause variable impedance element 104 to have different impedance values, which provide for different gain values of circuit 100. The gain for this circuit can be expressed as R1/R2.

There are other possible configurations for amplification. For instance, impedance elements 104 and 105 can both be variable. The impedance elements 104 and 105 can be implemented as switched resistors, switched-capacitive elements, or a combination of both. The methods for tuning the value of impedance element 105 can be varied, but one approach is to create an array of switchable elements, as shown in FIG. 2.

Figure 2:
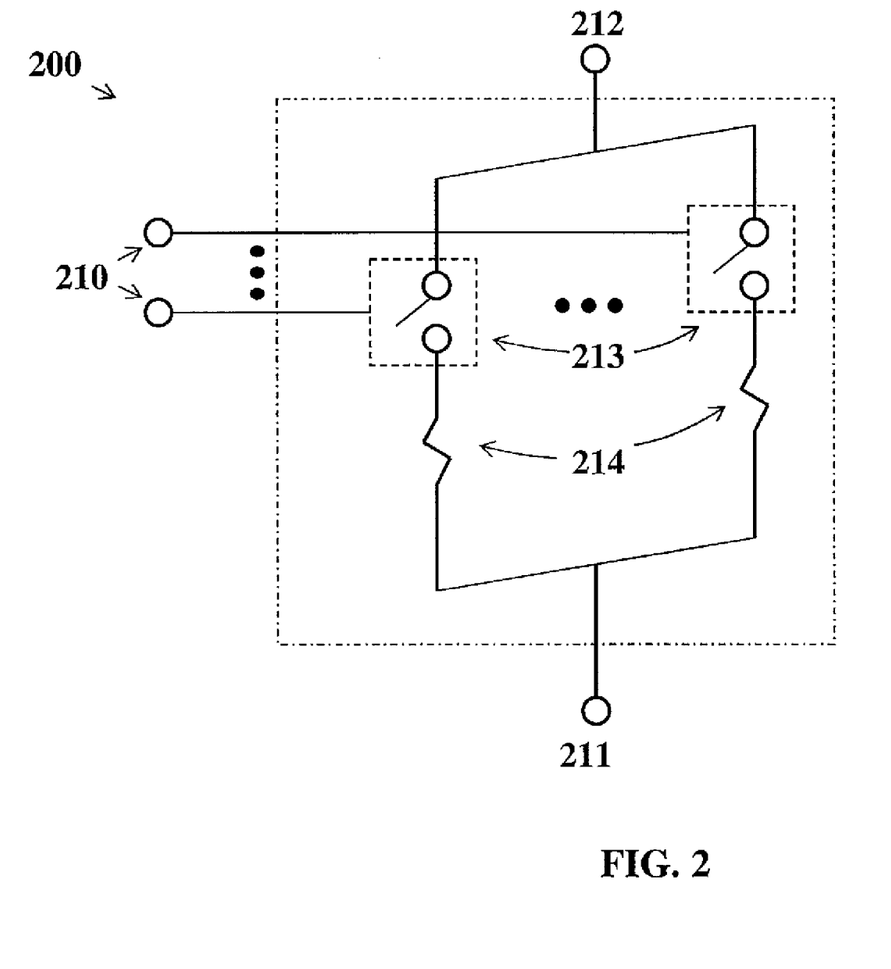
FIG. 2 is a schematic of an example of a digitally-switched impedance element.

FIG. 2 is a schematic of an example of a digitally-switched impedance element 200. In particular, a variable gain amplifier with a digitally-switched impedance element 200, in which the digitally-switched impedance element 200 can be used, for example, for impedance element 104 and/or 105. Impedance element 200 includes terminals 211 and 212. A set of resistor elements 214 in series with switches 213 are arranged in parallel between terminals 211 and 212. Digital control bits 210 are coupled to switches 213. The digital control bits 210 can be used to turn on or off respective switches 213 in order to select the appropriate value of the resistance between terminals 211 and 212. While shown in parallel, the resistor elements 214 and corresponding switches 213 can be in series, in parallel, or a combination of both. The resistor elements 214 and corresponding switches 213 may be replaced by capacitive, or both resistive and capacitive elements to create a tunable equivalent impedance between terminals 211 and 212. When using a variable impedance element such as impedance element 200 in, for example, circuit 100, the gain may be dependent on the switch resistances, as well as the tolerances of the resistor elements 214.

Figure 3:
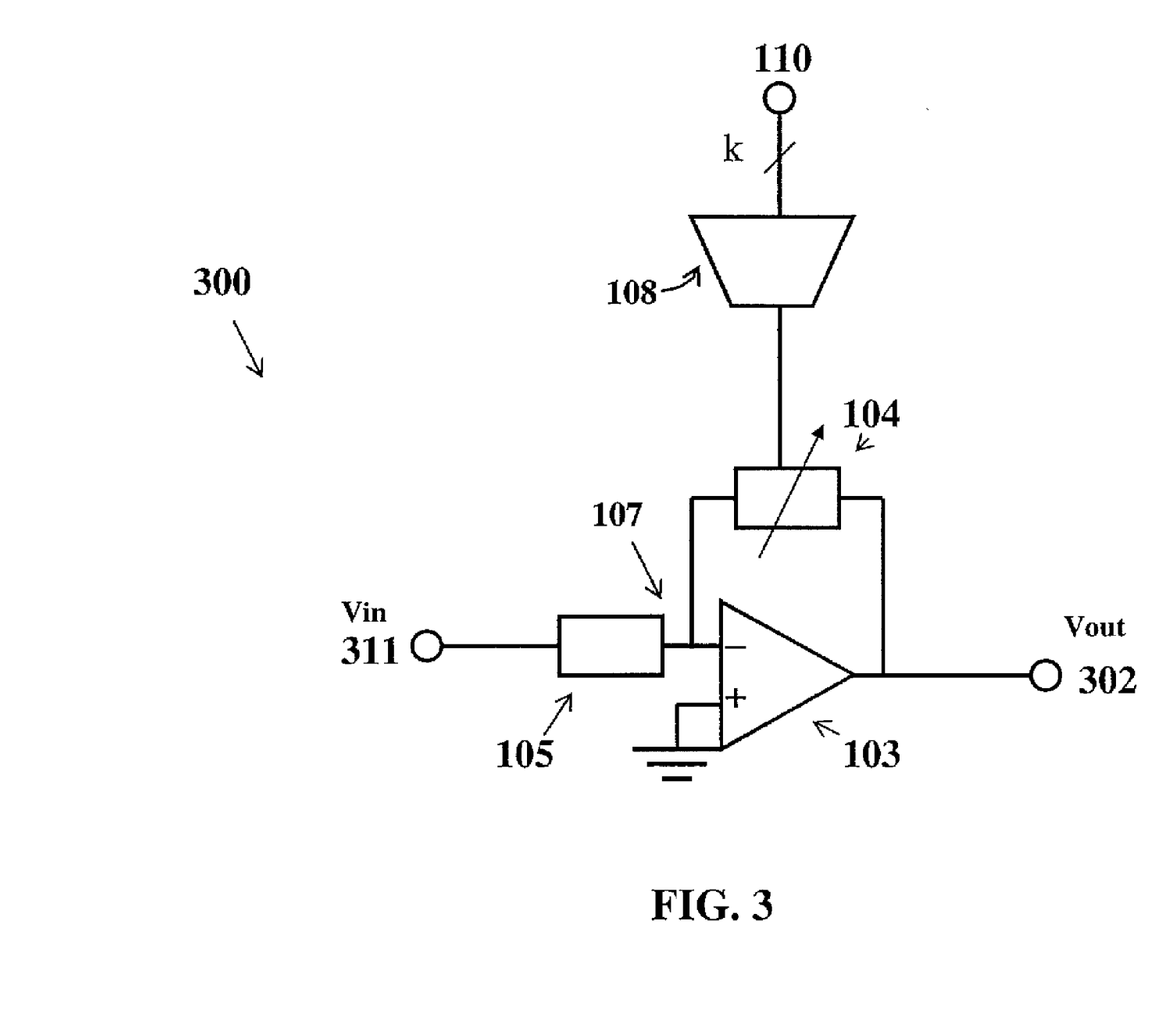
FIG. 3 is a schematic of an example of a variable gain amplifier with an analog-controlled impedance element.

FIG. 3 is a schematic of an example of a variable gain amplifier 300 with an analog-controlled impedance element. In particular, FIG. 3 shows an alternative implementation of a variable gain amplifier 300. The variable gain amplifier 300 is the same as variable gain amplifier 100, except that impedance element 104 is an analog-controlled, variable impedance element and the digital gain control 110 is coupled to a digital-to-analog converter (DAC) 108, which converts the digital control signal to an analog control signal. The analog signal controls the impedance of impedance element 104. Impedance element 104 is, for example, a voltage controlled impedance element and the analog control signal can provide a voltage that controls the impedance of impedance element 104.

Figure 4:
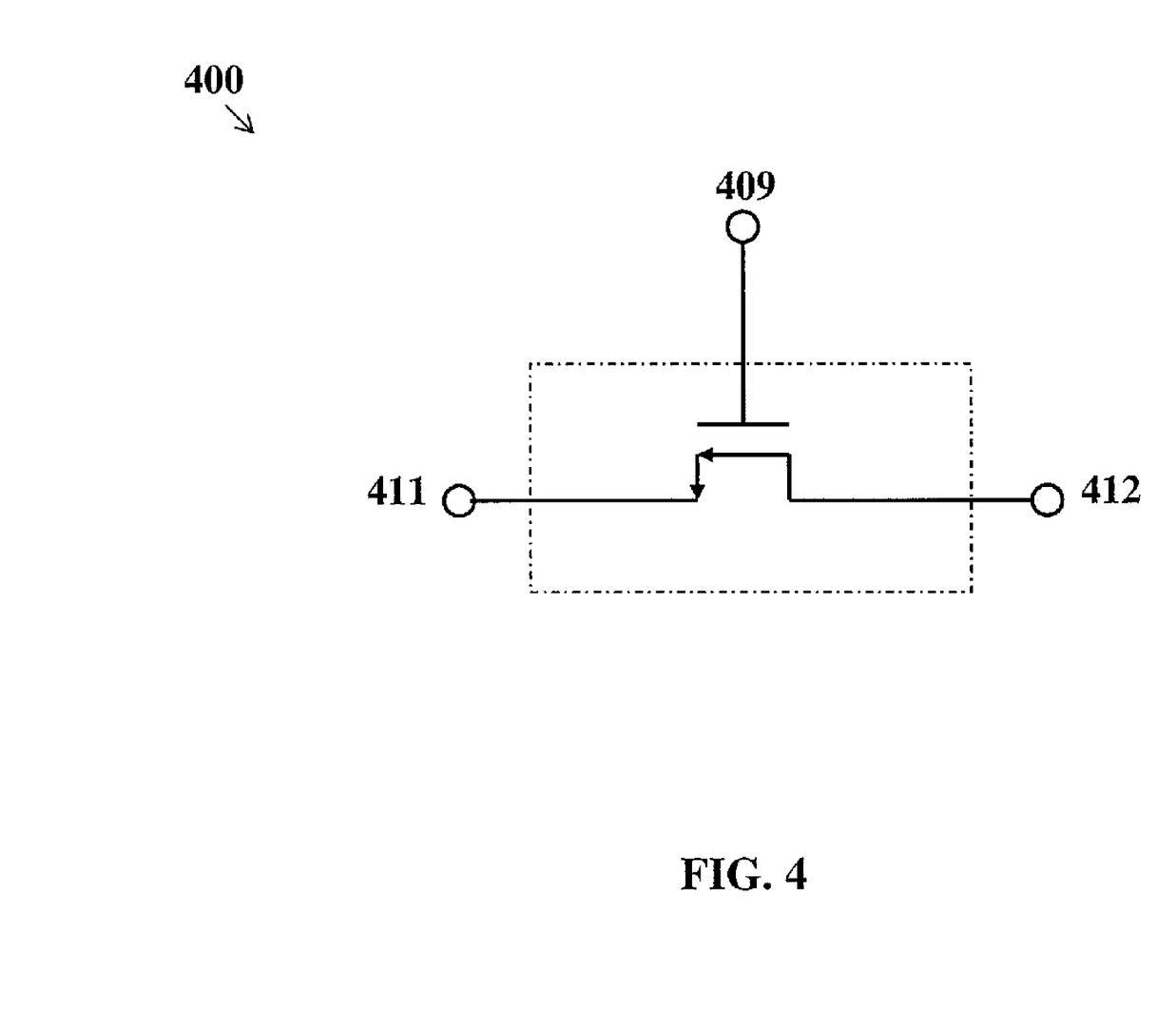
FIG. 4 is a schematic of an example of an analog-controlled impedance element.

FIG. 4 is a schematic of an example of an analog-controlled impedance element. In particular, FIG. 4 shows an example of an analog-controlled, variable impedance element implemented as a single MOS transistor 400. The MOS transistor includes the impedance of the MOS transistor 400 between transistor terminals 411 and 412, which can be varied as a function of the voltage applied at the gate terminal 409.

An impedance element, such as impedance element 104 in FIG. 3, can be non-linear, and the non-linearity of this element can cause the gain steps to be non-uniform. In addition, the impedance value of an impedance element can be dependent on the tolerances and device characteristics of the impedance element, which may affect the accuracy of gain steps in, for example, a variable gain amplifier. The use of a digital-to-analog (DAC) converter may not eliminate a requirement for tight device tolerances for accurate gain steps. In some implementations described herein, some gain component designs( e.g., amplifiers, mixers, multiplexers) can achieve fine gain steps accurately with a gain step size of less than 1 dB. In some of these implementations, the impedance element can be a pass gate.

Figure 5:
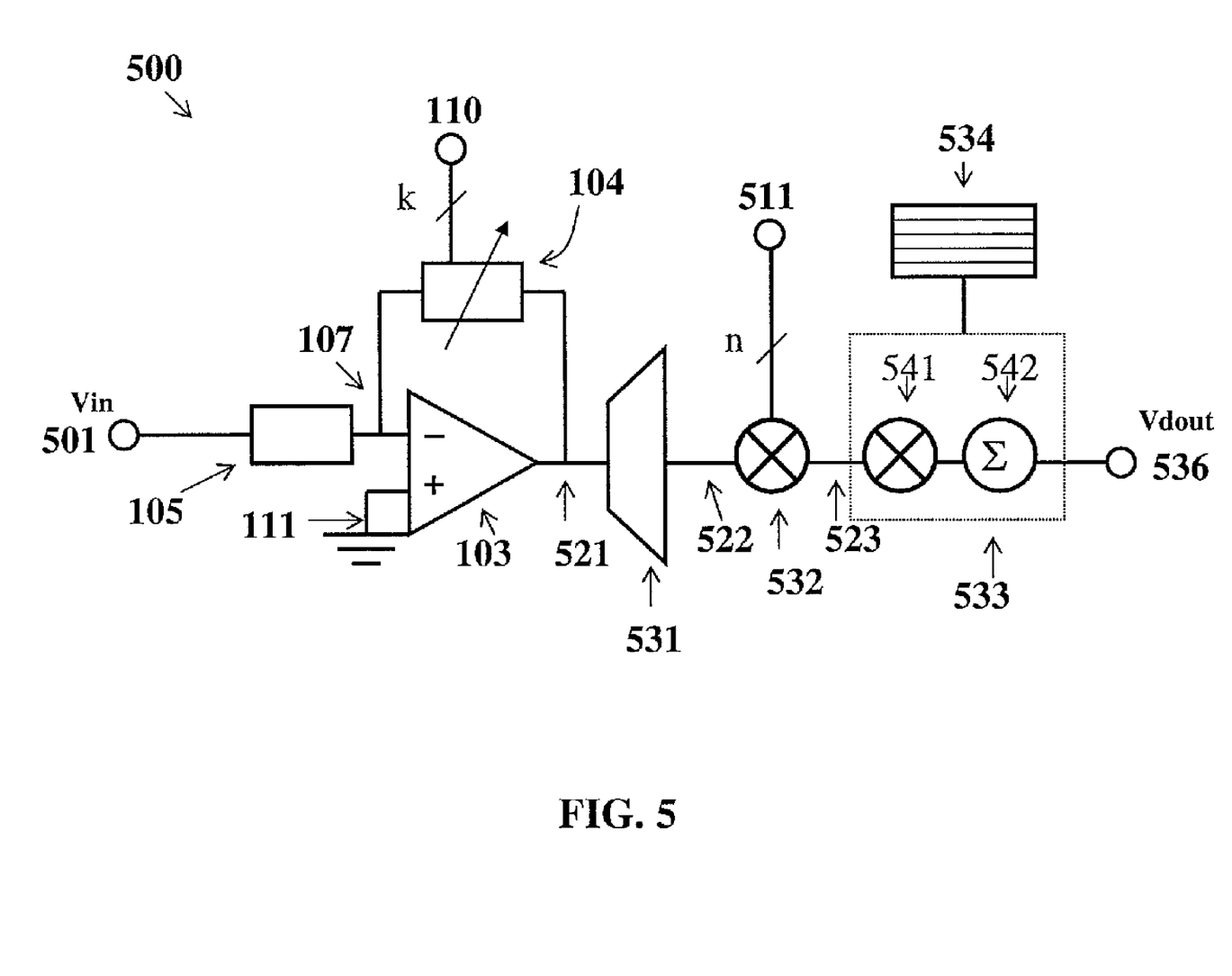
FIG. 5 is a schematic of an example of a gain system with an analog stage and a digital stage.

FIG. 5 is a schematic of an example of a gain system 500 with an analog stage and a digital stage coupled to an analog-to-digital converter (ADC). The ADC circuit includes both analog and digital circuits, and therefore, the ADC circuit may have analog errors. Specifically, FIG. 5 shows an example of a system 500 with gain components using an analog gain control and a digital gain control. The example circuit in FIG. 5 can be used for a receiver application. In particular, the circuit in FIG. 5 shows that an input signal Vin can be on an input terminal 501 that is coupled to an impedance element 105. The components for the amplifier 103, the impedance element 105, and the variable impedance element 104 for the variable gain amplifier, can be implemented as in FIG. 1, FIG. 2, FIG. 3, or FIG. 4 separately or in any combination. The output terminal 521 of the amplifier 103 is coupled to an analog-to-digital-converter (ADC) 531. The output terminal 522 of the ADC 531 is coupled to a digital multiplier 532. The digital multiplier 532 is coupled to a fine gain control input 511, and an output of the digital multiplier is coupled to an input terminal 523 of a compensation block 533 that includes a digital multiplier 541 coupled to a summer 542. The block 533 has one or more inputs from a compensation table 534, and the output terminal of the block 533 is the output terminal 536 of the circuit 500 for a digital output signal Vdout with fine tuning steps.

In system 500, the gain steps of the analog front-end can use coarse tuning, for example, 1 dB gain steps and the digital section can use fine gain steps, for example, less than 1 dB. System 500 can have digital gain controls 110 and 511 with a digital gain control word that can be divided into a coarse gain control 110 of k bits and a fine gain control 511 of n bits The fine gain steps can be made into very fine steps, for example in $\frac{1}{16}$ dB steps. The input terminal 501 can have an analog input signal Vin, which can be passed through an operational amplifier 103 to produce an amplified analog signal at terminal 521. Impedance elements 104 and 105 can be used to set the coarse analog gain. A specified coarse analog gain can be given as a function of the digital gain of k bits. In this example, the impedance value of impedance element 105 can be fixed and the variable impedance of impedance element 104 can be controlled by the digital gain control 110. If the impedance of element 104 is R1 and the impedance of element 105 is R2, then the gain for the analog signal in the circuit 500 can be R1/R2. The amplified analog signal can be converted to a digital signal at terminal 522 via the analog-to-digital-converter 531. The analog-to-digital-converter 531 can be implemented by a variety of different techniques, including sigma-delta ADC, oversampling, and/or noise-shaping techniques, for high resolution and insensitivity to device tolerances and manufacturing variations.

The first digital multiplier 532 multiplies the digital signal at terminal 522 with n bits digital gain of the fine gain control 511 to produce a fine gain digital signal at terminal 523. The fine gain digital signal at 523 can be adjusted via multiplication or summation operations by one or both of a digital multiplier 541 and summer 542 in block 533. The multiplication or summation operations can be performed via an entry in a compensation table 534 to compensate for analog gain errors or DC offset, respectively. The final output on the output terminal 536 is a digital output signal Vdout. The digital output signal Vdout can then be used in a digital receiver, for example, and/or in demodulation and decoding algorithms. In some implementations, the entries of the compensation table 534 can be derived by calibration through measurement. This calibration can be done by either automatic or manual calibration. In some implementations, the compensation block 533 can also be used as a core component of a calibration circuit. In other implementations, the n bit fine gain control can be combined with a compensation gain for a second multiplier in the compensation gain table and use only one multiplier (e.g., multiplier 532) for both fine gain and compensation gain. The summer 542 can be used to compensate for DC offset.

Figure 6:
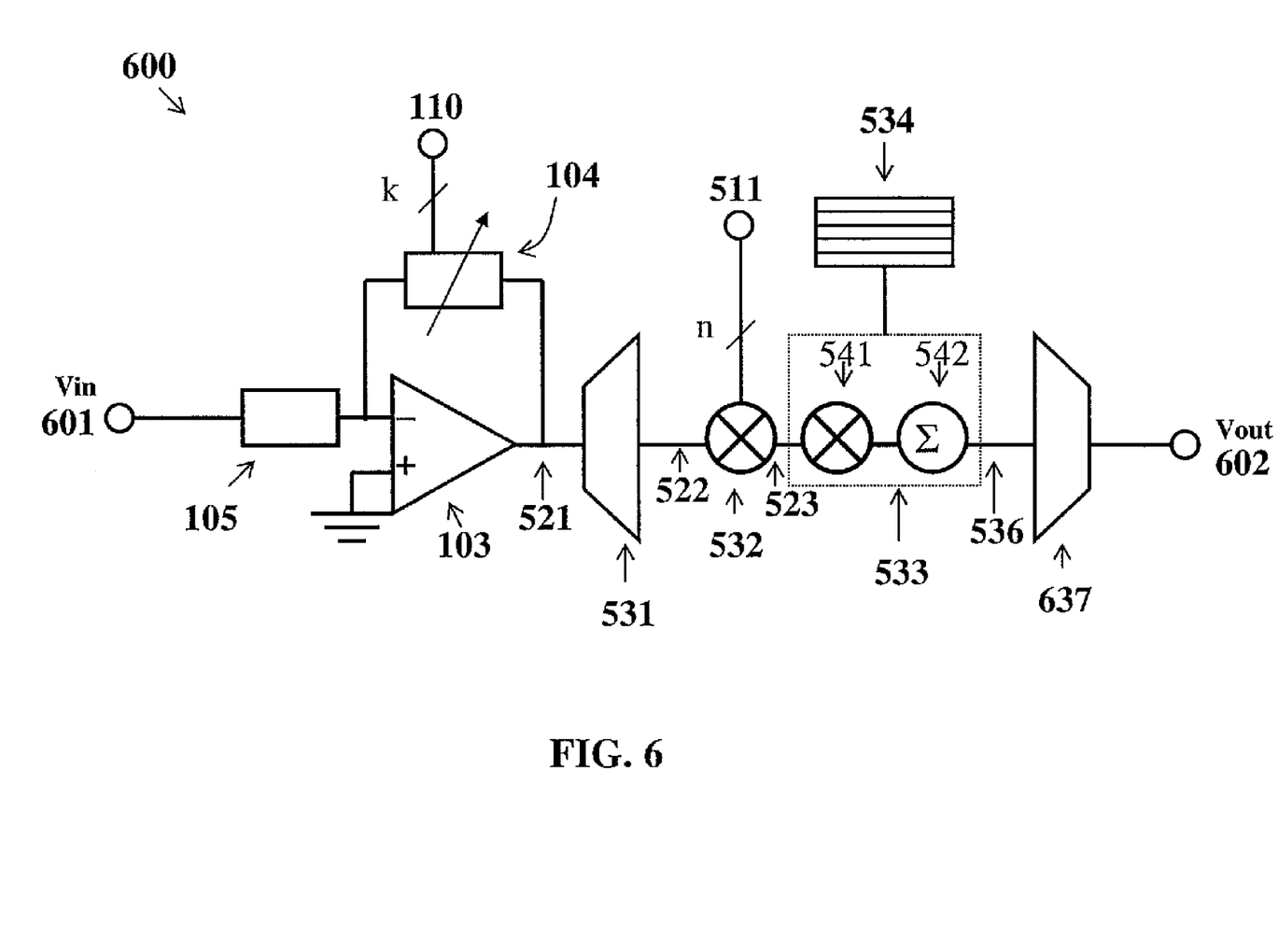
FIG. 6 is a schematic of another example of a gain system with an analog stage and a digital stage.

FIG. 6 is a schematic of another example of a gain system 600 with an analog stage and a digital stage coupled via an analog-to-digital converter (ADC). In particular, the system 600 can be similar to the implementation shown in FIG. 5, with the addition of a digital-to-analog converter (DAC) 637 in order to produce an analog output signal Vout at output terminal 602. The DAC 637 is coupled to a terminal 536 at the output of the block 533 and the output terminal 602 of the circuit 600. Producing an analog output signal Vout can be useful, for example, if the communication system requires or uses an analog output from the gain system 600. In system 600, an analog output signal Vout can be taken from output terminal 602 and a digital output signal can be taken from terminal 536.

Figure 7:
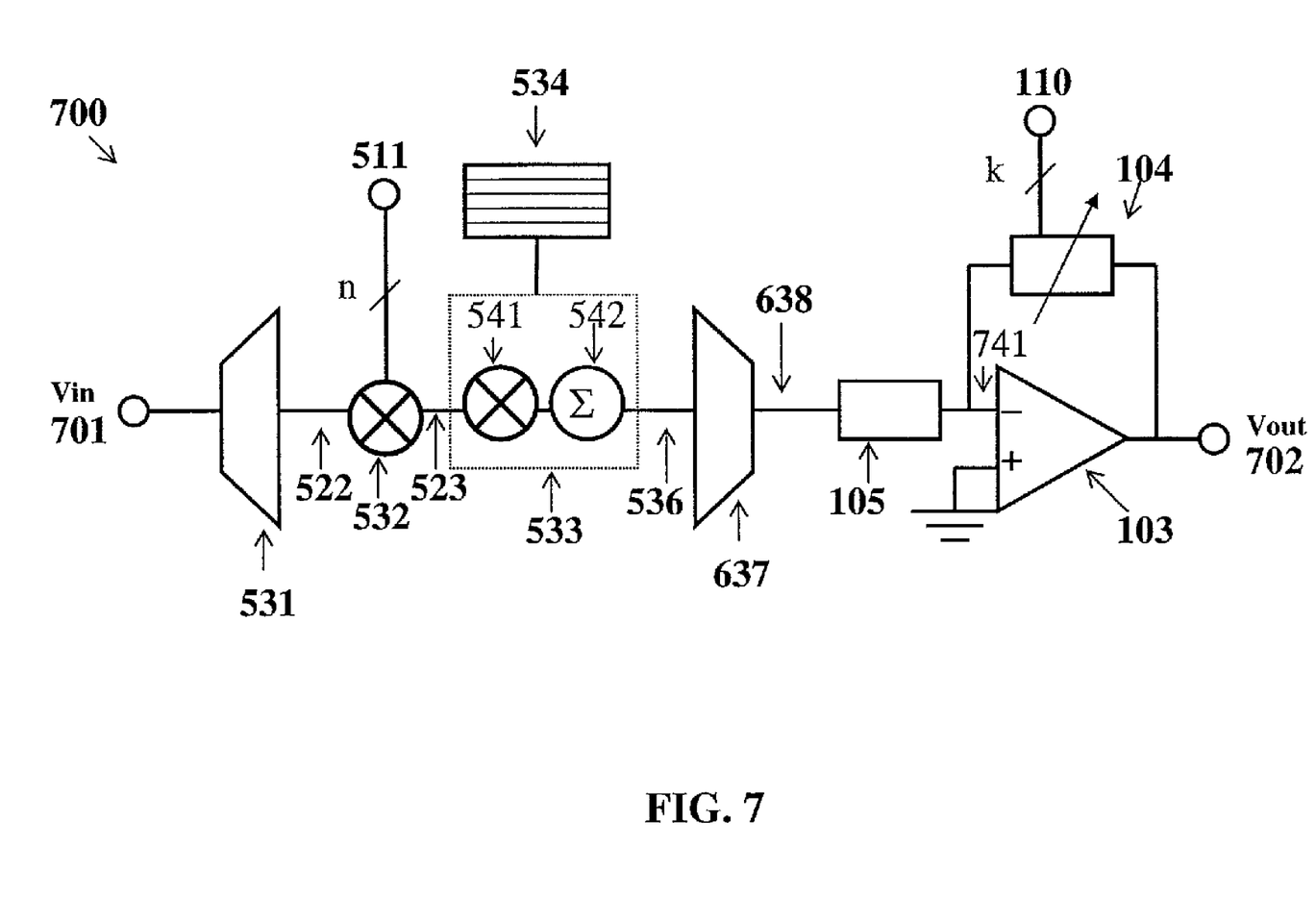
FIG. 7 is a schematic of another example of a gain system with an analog stage and a digital stage.

FIG. 7 is a schematic of an another example of a gain system 700 with an analog stage and a digital stage coupled via a digital-to-analog converter (DAC). In particular, FIG. 7 shows an implementation in which the analog and digital stages of the variable gain amplification are interchanged from the implementation of FIG. 6, so that the fine digital gain steps can be applied first and the coarse analog steps can be applied second. In system 700, an input analog signal Vin at input terminal 701 is converted to a digital signal at terminal 522 via an analog-to-digital-converter 531. The analog-to-digital converter 531 can be implemented by a variety of different techniques, such as sigma-delta ADC, oversampling, and/or noiseshaping techniques, for high resolution and insensitivity to device tolerances. A digital multiplier 532 multiplies the digital signal at terminal 522 with the n bits fine gain signal of the gain control 511 to produce the fine gain digital signal at terminal 523. The fine gain digital signal at terminal 523 is then multiplied by digital multiplier 541 and summed with a summer 541 in block 533 by an appropriate entry in compensation table 534. Entries in the compensation table 534 can provide for compensation for analog gain control tolerances and errors. The resultant digital signal at terminal 536 can be converted by the digital-to-analog converter 637 to an analog signal at terminal 638. The analog signal at terminal 638 is passed through an operational amplifier 103 to produce an amplified analog signal at terminal 541. Impedance elements 104 and 105 can be used to set the coarse analog gain. A specified coarse analog gain can be expressed at a digital gain control 110 with a k bit signal. In this example, impedance element 105 can be fixed and impedance element 104 can be controlled by the digital gain control 110. If the impedance of element 104 is R1 and the impedance of element 105 is R2 then the gain for this circuit can be R1/R2. The final analog output signal Vout at output terminal 702 can be expressed as the variable gain controlled version of the analog input signal Vin.

Figure 8:
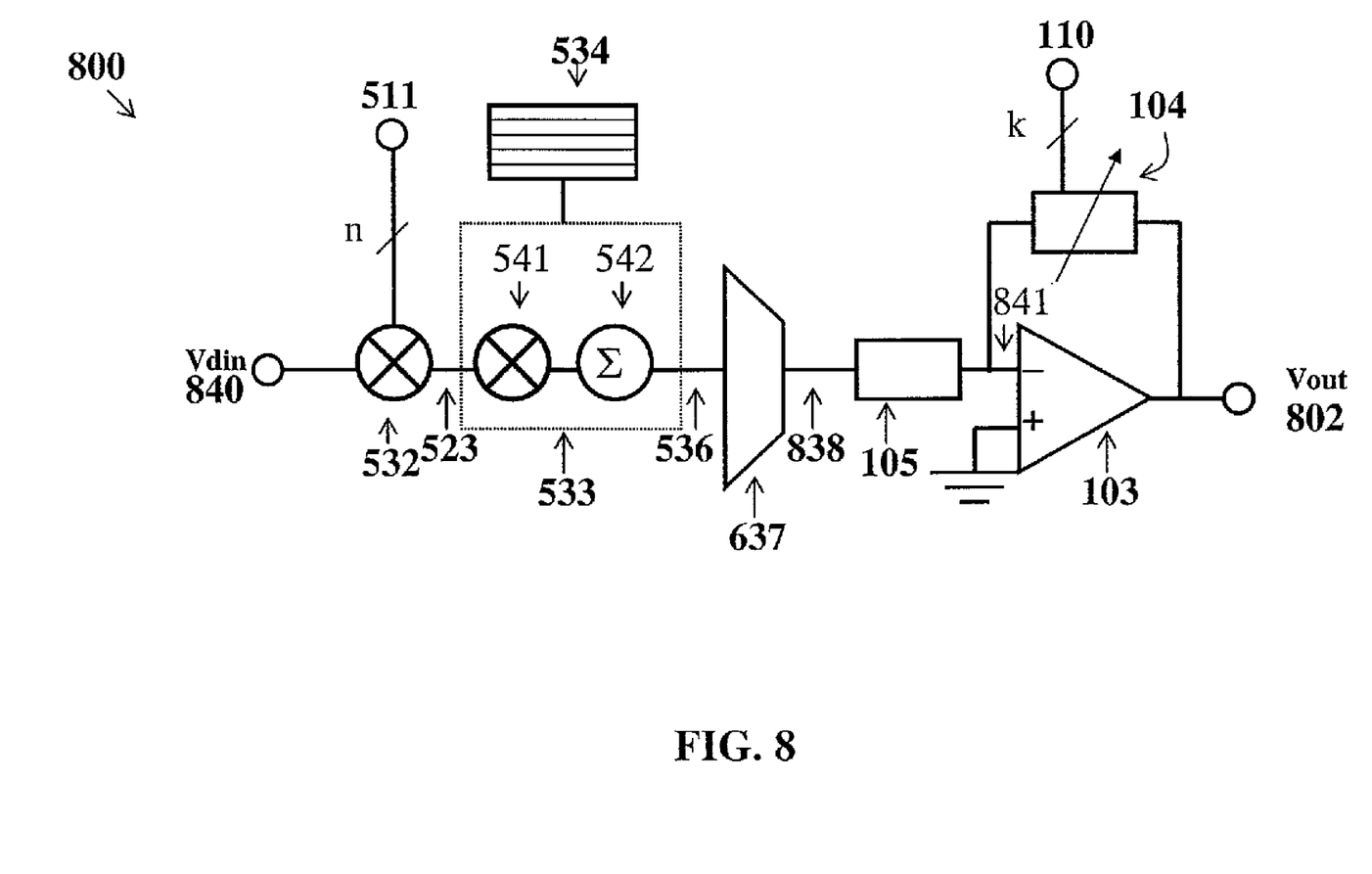
FIG. 8 is a schematic of another example of a gain system with an analog stage and a digital stage.

FIG. 8 is a schematic of another example of a gain system 800 with an analog stage and a digital stage coupled via a digital-to-analog converter (DAC). System 800 can be used, for example, in a transmitter application. System 800 is similar to system 700, except the input of the system 800 is a digital input signal value Vdin, and the ADC 531 in system 700 is removed. In system 800, the digital input signal at input terminal 840 is a digital signal that may need to be converted to an analog signal to be amplified by the variable gain amplifier. A digital multiplier 532 multiplies a digital input signal Vdin from input terminal 840 with the n-bit fine gain signal at the fine gain control 511 to produce fine gain digital signal at terminal 523. The fine gain digital signal at terminal 523 is then multiplied by digital multiplier 541 and summed with a summer 541 in block 533 using an entry in compensation table 534 for compensation. The compensation can be, for example, for analog gain control tolerances and errors. The resultant digital signal at terminal 536 is converted by a digital-to-analog converter 637 to an analog signal at terminal 838. The analog signal at terminal 838 is passed through an operational amplifier 103 to produce an amplified analog signal at terminal 841. Impedance elements 104 and 105 can be used to set the coarse analog gain. The specified coarse analog gain can be expressed as a function of a digital gain of k bits at the digital gain control 110. In this example, impedance element 105 can be fixed and impedance element 104 can be controlled by the digital gain control 110. For instance, if the impedance of element 104 is R1 and the impedance of element 105 is R2 then the gain for this circuit can be R1/R2. The final analog output signal Vout at output terminal 802 can be expressed as the variable gain controlled version of the digital input signal Vdin at input terminal 840.

Figure 9:
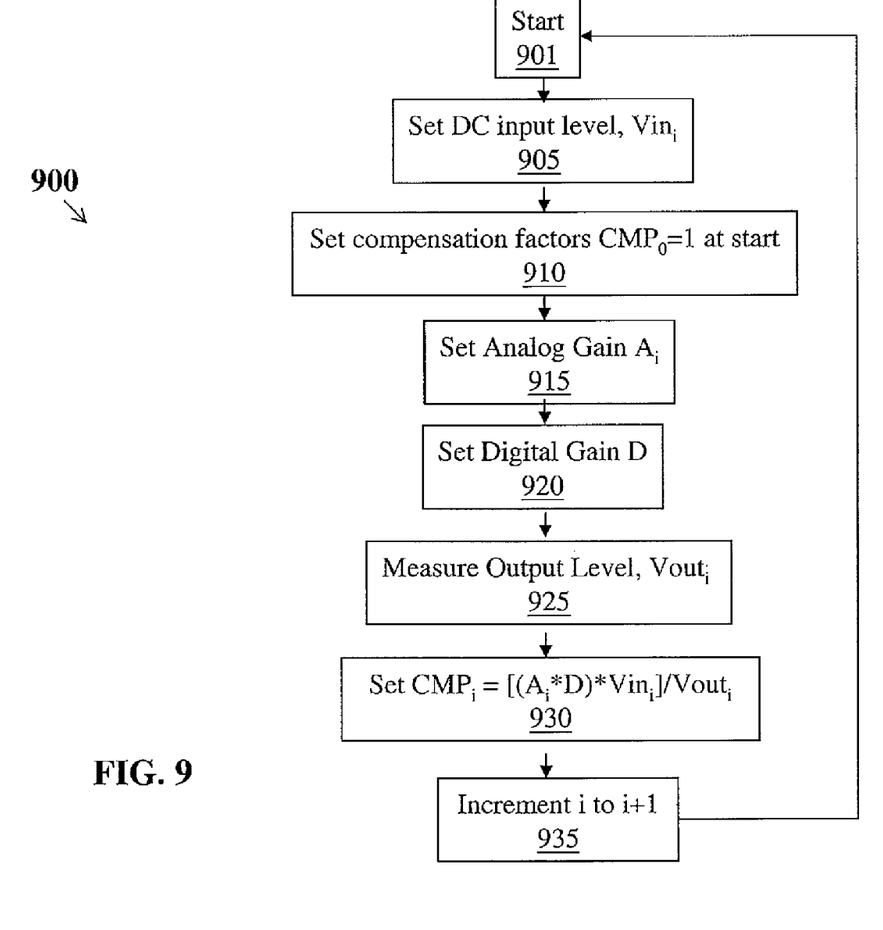
FIG. 9 is a flow chart of illustrating a calibration process to compensate for analog gain errors.

FIG. 9 is a flow chart illustrating a calibration process 900 to compensate for analog gain errors. In particular, process 900 is an example of a calibrating method that can be used to obtain the compensation table 534. The process 900 starts (901) with setting a test input $Vin_i$ of a DC voltage (905). An initial value of the gain for the compensation multiplier in the compensation table 534 is set to 1 (910) for no compensation at the start. A compensation value $CMP_i$ is used for an analog coarse gain step i. An analog gain $A_i$ is set (915) and all digital gains are set to the same value D, for example, D=1 (920). The output signal $Vout_i$ is measured (925). A multiplicative calibration technique, which is expressed as $CMP_i=[(A_i*D)*Vin_i]/Vout_i$, is employed (930). The analog coarse gain step i is then incremented (935). Each $CMP_i$ for each analog gain step $A_i$ can be obtained by repeating the same calibration process.

In this example, the $CMP_0$ is set at 1 for no gain, and a first compensation value $CMP_1$ is calculated to be $A_1*1*Vin_i/Vout1$. $CMP_1$ is then entered in the compensation table 534 to be used for the next step. The steps can be repeated (901) until all the gains are obtained.

There can be one or more calibration methods that could be used to populate the compensation table 534 with correction factors for the analog gain. In some example calibration methods, known fixed inputs can be used and the outputs of the variable gain amplifier with various analog and digital gain settings can be compared in order to determine the magnitude of the analog errors. In some implementations, the fine digital gain steps can be large enough to overlap at least one coarse analog gain step so that the analog and digital gain steps can be compared to each other. Because the digital gain steps may be exact, an analog gain error can be found and compensated for via the compensation table 534.

In some implementations, the gain circuits can be pre-calibrated prior to circuit operation, results from the calibration can be stored in the compensation table 534, and the compensation table 534 can be employed to correct errors and/or offsets during operation of the gain circuits. In some of these implementations, the pre-calibration can occur during a testing stage of the circuit manufacturing process. In other implementations, the circuits can have values set and/or updated in the compensation table 534 during operation of the gain circuits.

In some implementations, the compensation table 534 can be set using a test setting of at least one overlapping digital and analog gain step. The values in the table can be linear or non-linear with respect to one another. The table may be implemented in hardware or software. In some implementations, the summers and multipliers can be used interchangeably and operations of the circuits can be expressed mathematically. In other implementations, an order of the elements of the circuit design may be interchanged. Generally, "correcting" or "reducing" errors for the calibration and/or compensation architectures and/or techniques herein may refer to architectures and/or techniques to correct errors, reduce a number of errors, and/or reduce an amount or a level of an error.

While the implementations presented herein use single-ended structures, differential structures can be used in their place with the added advantages of improved symmetry and more robustness to noise. In addition, various types of data converters for analog-to-digital and digital-to-analog conversions, including delta sigma modulators of various orders, various numbers of output bits, various structures, and various implementations can be used. Other types of data converters could include successive approximation, oversampling, or noiseshaping data converters. Various types of analog gain control methods can be used. Various kinds of digital multipliers can be used and various bit resolutions for the digital multiplier can be used. The implementations shown herein are scalable for various process technologies, including process technologies with minimum transistor gate lengths at or below 0.25 m. Various methods for calibrating the compensation table can be used. The circuits can be implemented in various integrated circuit technologies, such as CMOS, SiGe, and GaAs. Additional and/or different features may be encompassed by the following.

The system or design can include other components, where the circuit can couple with those components. Some of the components may include computers, processors, clocks, radios, signal generators, counters, test and measurement equipment, function generators, oscilloscopes, phase-locked loops, frequency synthesizers, phones, wireless communication devices, and components for the production and transmission of audio, video, and other data.

In some implementations, gain steps can be achieved much finer than 0.1 dB or less without sensitivity to device tolerances. A number of implementations have been described. Nevertheless, it will be understood that various modifications may be made. Accordingly, other implementations are within the scope of the following claims.

What is claimed is:

1. A gain circuit to generate fine tuning of gain steps, the gain circuit comprising:
   an analog section comprising an input terminal and an output terminal;
   wherein:
      the analog section is used to receive an analog input signal at the input terminal of the analog section and generate an analog output signal at the output terminal of the analog section,
      the analog section is used to control the analog output signal at the output terminal of the analog section with coarse tuning of the analog input signal,
      the coarse tuning comprises a first set of gain steps, and the first set of gain steps correspond to the analog section;
      the output terminal of the analog section is coupled to an input terminal of the digital section; and
   a digital section comprising the input terminal and an output terminal;
   wherein:
      the digital section is used to generate a digital output signal at the output terminal of the digital section; and
      the digital section is used to control the digital output signal at the output terminal of the digital section with fine tuning of the analog output signal,
      the fine tuning comprises a second set of gain steps,
      the second set of gain steps corresponds to the digital section, and
   wherein a first gain step resolution corresponding to the second set of gain steps is greater than a second gain resolution corresponding to the first set of gain steps.

2. The gain circuit of claim 1, wherein the resolution of the first set of gain steps is on an order of 1 dB, and the resolution of the second set of gain steps is from an order of 0.01 dB or less.

3. The gain circuit of claim 1, wherein the analog section comprises an analog-to-digital converter (ADC) to provide analog-to-digital conversion of the analog output signal at the output terminal of the analog section.

4. The gain circuit of claim 1, further comprising a control circuit to generate gain controls for the first and the second sets of gain steps.

5. The gain circuit of claim 1, wherein the analog section comprises one or more components for analog gains, wherein the digital section comprises any combination of a digital signal processor, a compensation circuit, or one or more digital components; wherein the digital signal processor or the one or more digital components are for executing signal processing operations or producing the fine tuning of the gain steps.

6. The gain circuit of claim 5 further comprising a compensation circuit to correct one or more errors, the compensation circuit to use the digital signal processor or the one or more digital components to correct analog errors generated by the analog section.

7. The gain circuit of claim 6, further comprising a compensation table comprising one or more compensation values.

8. The gain circuit of claim 7, wherein the compensation values are determined before operation of the gain circuit, determined by instructions sent to the gain circuit, or calculated dynamically during operation of the gain circuit.

9. The gain circuit of claim 8, further comprising a calibration circuit to calibrate the compensation values manually or automatically.

10. The gain circuit of claim 1, wherein the digital section further comprises a digital-to-analog converter (DAC) coupled at the output terminal of the digital section.

11. The gain circuit of claim 1, wherein the gain circuit comprises a digital-to-analog converter (DAC) that has an output terminal that is coupled to the input terminal of the analog section, and wherein the DAC comprises functionality to receive a digital input signal for the gain circuit and convert the received digital input signal to the analog input signal at the input terminal of the analog section.

12. The gain circuit of claim 1, wherein the gain circuit comprises a variable gain amplifier.

13. The gain circuit of claim 1, wherein the resolution of the first set of gain steps is on an order of 1 dB, and the resolution of the second set of gain steps is from less than 1 dB to an order of 0.01 dB or less.

14. A method to calibrate one or more values to compensate for errors generated by a gain circuit, the method comprising:
for a gain circuit with an analog section that has an output terminal coupled to an input terminal of a digital section, generating an analog input signal for the analog section at a start of a calibration process, wherein the analog and digital sections comprises gain controls for setting gain levels;
setting a first compensation gain value for an initial compensation gain level to 1 dB;
for the analog section, setting an analog gain control for a coarse gain level to a first gain step;
generating an analog output signal at the output terminal of the analog section;
sending the analog output signal to an analog-to-digital converter (ADC);
for the digital section, coupling a digital output of the digital-to-analog converter to the input terminal of the digital section;
for the digital section, setting a digital gain control for a fine gain level to a constant value;
generating a digital output signal at an output terminal of the digital section;
measuring the digital output signal;
calculating a second compensation gain value for the coarse gain level of the first gain step using data from the analog input signal, the digital output signal, the coarse gain level, and the fine gain level; and
storing the second compensation value.

15. The method of claim 14, wherein a resolution of the first gain step is on an order of 1 dB, and a resolution of a gain step corresponding to the fine gain level is from less than 1 dB to an order of 0.01 dB or less.

16. The method of claim 14, wherein the gain circuit comprises a variable gain amplifier (VGA).

* * * * *